(12) United States Patent
Pisek et al.

(10) Patent No.: US 7,603,613 B2
(45) Date of Patent: *Oct. 13, 2009

(54) VITERBI DECODER ARCHITECTURE FOR USE IN SOFTWARE-DEFINED RADIO SYSTEMS

(75) Inventors: Eran Pisek, Plano, TX (US); Jasmin Oz, Plano, TX (US); Yan Wang, Plano, TX (US)

(73) Assignee: Samsung Electronics Co., Ltd., Suwon-si (KR)

( * ) Notice: Subject to any disclaimer, the term of this patent is extended or adjusted under 35 U.S.C. 154(b) by 645 days.

This patent is subject to a terminal disclaimer.

(21) Appl. No.: 11/314,460

(22) Filed: Dec. 21, 2005

(65) Prior Publication Data

US 2006/0195773 A1 Aug. 31, 2006

Related U.S. Application Data

(60) Provisional application No. 60/682,339, filed on May 18, 2005, provisional application No. 60/653,968, filed on Feb. 17, 2005.

(51) Int. Cl.
*H03M 13/03* (2006.01)
(52) U.S. Cl. .................. 714/795; 714/792; 714/799
(58) Field of Classification Search ............... 714/795, 714/786, 792, 773, 778, 800, 799, 759
See application file for complete search history.

(56) References Cited

U.S. PATENT DOCUMENTS

| 5,935,270 | A | 8/1999 | Lin | |
|---|---|---|---|---|
| 6,311,200 | B1 * | 10/2001 | Hanrahan et al. | 708/232 |
| 6,408,420 | B1 | 6/2002 | Todoroki | |
| 7,117,426 | B2 * | 10/2006 | Wu et al. | 714/795 |
| 7,159,109 | B2 * | 1/2007 | Egevang | 713/160 |
| 2002/0095639 | A1 * | 7/2002 | Ahmed et al. | 714/786 |
| 2004/0243908 | A1 * | 12/2004 | Box et al. | 714/759 |
| 2005/0034051 | A1 * | 2/2005 | Chun et al. | 714/795 |

FOREIGN PATENT DOCUMENTS

| EP | 0 973 292 A2 | 1/2000 |
|---|---|---|
| JP | 09-064755 | 3/1997 |
| JP | 2001-156651 | 6/2001 |
| JP | 2003-023359 | 1/2003 |
| RU | 2127944 C1 | 3/1999 |
| RU | 2179367 C2 | 2/2002 |

\* cited by examiner

*Primary Examiner*—Scott T Baderman
*Assistant Examiner*—Fritz Alphonse

(57) ABSTRACT

A reconfigurable Viterbi decoder comprising a reconfigurable data path and a programmable finite state machine that controls the reconfigurable data path. The reconfigurable data path comprises a plurality of reconfigurable functional blocks including: i) a reconfigurable branch metric calculation block; and ii) a reconfigurable add-compare-select and path metric calculation block. The programmable finite state machine executes a plurality of context-related instructions associated with the reconfigurable Viterbi decoder.

50 Claims, 6 Drawing Sheets

VITERBI DECODER ARCHITECTURE FOR USE IN SOFTWARE-DEFINED RADIO SYSTEMS

CROSS-REFERENCE TO RELATED APPLICATION AND CLAIM OF PRIORITY

This application is related to U.S. Provisional Patent No. 60/682,339, filed May 18, 2005, entitled "Viterbi Decoder Architecture For Software-Defined Radio" and to U.S. Provisional Patent No. 60/653,968, filed Feb. 17, 2005, entitled "Context-Based Operation Reconfigurable Instruction Set Processor." U.S. Provisional Patent Nos. 60/682,339 and 60/653,968 are assigned to the assignee of this application and are incorporated by reference into this disclosure as if fully set forth herein. This application hereby claims priority under 35 U.S.C. §119(e) to U.S. Provisional Patent Nos. 60/682,339 and 60/653,968.

This application is related to U.S. patent application Ser. No. 11/123,313, now pending filed on May 6, 2005, entitled "Context-based Operation Reconfigurable Instruction Set Processor and Method of Operation." Application Ser. No. 11/123,313 is assigned to the assignee of this application and is incorporated by reference into this application as if fully set forth herein.

TECHNICAL FIELD OF THE INVENTION

The present application relates generally to Viterbi decoders and, more specifically, to a Viterbi decoder implemented using a context-based operation reconfigurable instruction set processor (CRISP).

BACKGROUND OF THE INVENTION

To improve throughput, many communication systems implement some type of forward error correction (FEC) technique. This is particularly true of wireless communication systems, such as cellular networks. One of the most common FEC techniques is known as convolutional coding with Viterbi decoding. Convolutional coding with Viterbi decoding is particularly useful for channels in which additive white Gaussian noise (AWGN) distorts the transmitted signal.

A Viterbi decoder is the maximum likelihood sequence decoder for a convolutional code. Viterbi decoders have been adopted for use in the physical layers of a number of wireless standards, including WCDMA, CDMA2000, IEEE-802.16e (i.e., WiBro) and others. These standards operate at different data rates and implement convolutional encoders in the transmitters and Viterbi decoders in the receivers that are optimized for only one or two specific standards. Also, most conventional convolutional encoders and Viterbi decoders operate at relatively low data rates.

A software-defined radio (SDR) device uses reconfigurable hardware that may be programmed over-the-air to operate under different wireless standards. For example, an SDR transceiver in a wireless laptop computer or PDA may be configured by different software loads to operate in an IEEE-802.11x wireless network, a CDMA2000 wireless network, an OFDM/OFDMA wireless network, a GSM wireless network, or another type of network. Many of these wireless standards require the use of Viterbi decoders.

However, conventional Viterbi decoders have significant drawbacks with respect to SDR applications. As noted above, conventional Viterbi decoders are optimized for decoding under only one or two specific (and similar) standards. If an SDR device must support many wireless standards, more than one Viterbi decoder must be implemented in the SDR device. This leads to a complex transceiver design that inefficiently uses chip space and consumes an excessive amount of power.

Also, many new wireless standards operate at relatively high data rates (e.g., WiBro, HSPDA, and the like). A Viterbi decoder that is optimized in terms of speed and power consumption for a low data rate standard is unlikely to be optimized in terms of speed and power consumption for a high data rate standard, and vice versa. Thus, conventional Viterbi decoders are not suitable for SDR applications.

Therefore, there is a need in the art for an improved reconfigurable Viterbi decoder for use in a software-defined radio (SDR) system.

SUMMARY OF THE INVENTION

A reconfigurable Viterbi decoder is disclosed herein. The reconfigurable Viterbi decoder comprises a reconfigurable data path comprising a plurality of reconfigurable functional blocks, the plurality of reconfigurable functional blocks including: i) a reconfigurable branch metric calculation block; and ii) a reconfigurable add-compare-select and path metric calculation block. The reconfigurable Viterbi decoder further comprises a programmable finite state machine capable of controlling the reconfigurable data path, wherein the programmable finite state machine is capable of executing a plurality of context-related instructions associated with the reconfigurable Viterbi decoder.

A software software-defined radio (SDR) system that implements a reconfigurable Viterbi decoder is also disclosed. The SDR system comprises: a radio-frequency (RF) transceiver portion capable of being reconfigured to operate under a plurality of wireless communication standards; and a reconfigurable baseband processing portion associated with the RF transceiver portion, wherein the reconfigurable baseband processing portion includes the reconfigurable Viterbi decoder.

Before undertaking the DETAILED DESCRIPTION OF THE INVENTION below, it may be advantageous to set forth definitions of certain words and phrases used throughout this patent document: the terms "include" and "comprise," as well as derivatives thereof, mean inclusion without limitation; the term "or," is inclusive, meaning and/or; the phrases "associated with" and "associated therewith," as well as derivatives thereof, may mean to include, be included within, interconnect with, contain, be contained within, connect to or with, couple to or with, be communicable with, cooperate with, interleave, juxtapose, be proximate to, be bound to or with, have, have a property of, or the like; and the term "controller" means any device, system or part thereof that controls at least one operation, such a device may be implemented in hardware, firmware or software, or some combination of at least two of the same. It should be noted that the functionality associated with any particular controller may be centralized or distributed, whether locally or remotely. Definitions for certain words and phrases are provided throughout this patent document, those of ordinary skill in the art should understand that in many, if not most instances, such definitions apply to prior, as well as future uses of such defined words and phrases.

BRIEF DESCRIPTION OF THE DRAWINGS

For a more complete understanding of the present disclosure and its advantages, reference is now made to the following description taken in conjunction with the accompanying drawings, in which like reference numerals represent like parts.

DETAILED DESCRIPTION OF THE INVENTION

FIGS. 1 through 8, discussed below, and the various embodiments used to describe the principles of the present disclosure in this patent document are by way of illustration only and should not be construed in any way to limit the scope of the disclosure. Those skilled in the art will understand that the principles of the present disclosure may be implemented in any suitably arranged processing system.

The reconfigurable Viterbi decoder disclosed herein provides a high degree of parallelism to support high data rate standards. The target downlink rate of WiBro is 12 Mbps and HSDPA achieves a peak data rate up to 14.4 Mbps. The disclosed Viterbi decoder architecture uses parallelism to achieve the necessary throughput at high data rates. This is achieved through the use of parallel execution units as well as pipelining techniques in order to achieve high data rates.

The reconfigurable Viterbi decoder supports multimode operation for decoding in different communication standards, including WCDMA, HSDPA, CDMA2000, IEEE-802.16e (i.e., WiBro), and GSM/EDGE, among others. The disclosed Viterbi decoder also provides adaptability to support different data rates. WiBro and WCDMA/HSDPA operate at many different data rates. The disclosed Viterbi decoder architecture is optimized not only for the maximum data rates but also for different ranges of data rate.

The reconfigurable Viterbi decoder also minimizes power consumption for different standards and data rates, since the Viterbi decoder may be implemented in handheld devices. Finally, a reconfigurable Viterbi decoder according to the principles of the present disclosure provides flexibility to the end user. Although the design targets Viterbi decoding, the architecture does not require stringent parameter restrictions. Thus, the design provides a general Viterbi decoder platform that enables end users to select parameters and algorithms based on end-user requirements.

The reconfigurable Viterbi decoder described herein is implemented using a context-based operation reconfigurable instruction set processor (CRISP) device. CRISP devices are described in detail in U.S. patent application Ser. No. 11/123, 313, which was incorporated by reference above.

Figure 1:
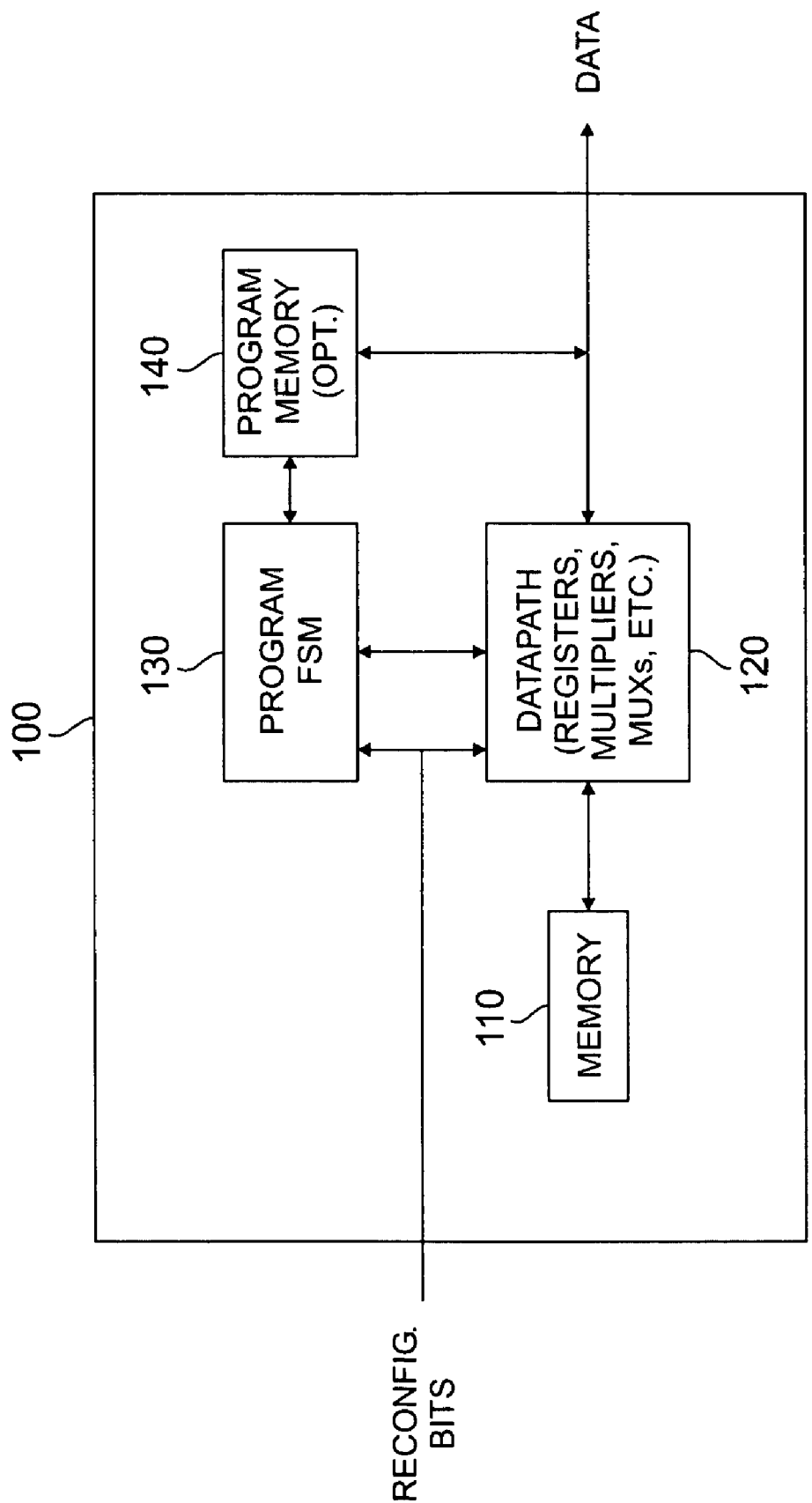
FIG. 1 is a high-level block diagram of a CRISP device that may be used to implement a reconfigurable Viterbi decoder.

FIG. 1 is a high-level block diagram of context-based operation reconfigurable instruction set processor (CRISP) 100, which may be used to implement a Viterbi decoder. CRISP 100 comprises memory 110, programmable data path circuitry 120, programmable finite state machine 130, and optional program memory 140. A context is a group of instructions of a data processor that are related to a particular function or application, such as Viterbi decoding instructions. As described in U.S. patent application Ser. No. 11/123,313, CRISP 100 implements only a subset of context-related instructions in an optimum manner.

Context-based operation reconfigurable instruction set processor (CRISP) 100 defines the generic hardware block that usually consists of higher level hardware processor blocks. The principle advantage to CRISP 100 is that CRISP 100 breaks down the required application into two main domains, a control domain and a data path domain, and optimizes each domain separately. By performing Viterbi decoding in CRISP 100, the disclosed Viterbi decoder reduces the problems related to flexibility and power consumption that affect conventional Viterbi decoders.

The control domain is implemented by programmable finite state machine 130, which may comprise a digital signal processor (DSP), a controller, or another conventional processing device. Programmable FSM 130 is configured by reconfiguration bits received from an external controller (not shown). Programmable FSM 130 may execute a program stored in associated optional program memory 140. The program may be stored in program memory 140 via the DATA line from an external controller (not shown). Memory 110 is used to store application data used by data path circuitry 120.

Programmable data path circuitry 120 is divided into sets of building blocks that perform particular functions (e.g., registers, multiplexers, multipliers, and the like). Each of the building blocks is both reconfigurable and programmable to allow maximum flexibility. The division of programmable data path circuitry 120 into functional blocks depends on the level of reconfigurability and programmability required for a particular application. In the context of a Viterbi decoder, these functional blocks may include a branch metric calculation block, an add-compare-select block, a path metric calculation block, a trellis and traceback block, buffers, random access memory (RAM), and other blocks, as described below in greater detail.

Since different contexts are implemented by separate CRISP devices that work independently of other CRISP devices, implementing a Viterbi decoder using one or more CRISP devices provides an efficient power management scheme that is able to shut down a CRISP device when the CRISP device is not required. This assures that only the CRISP devices that are needed at a given time are active, while other idle CRISP devices do not consume significant power.

Figure 2:
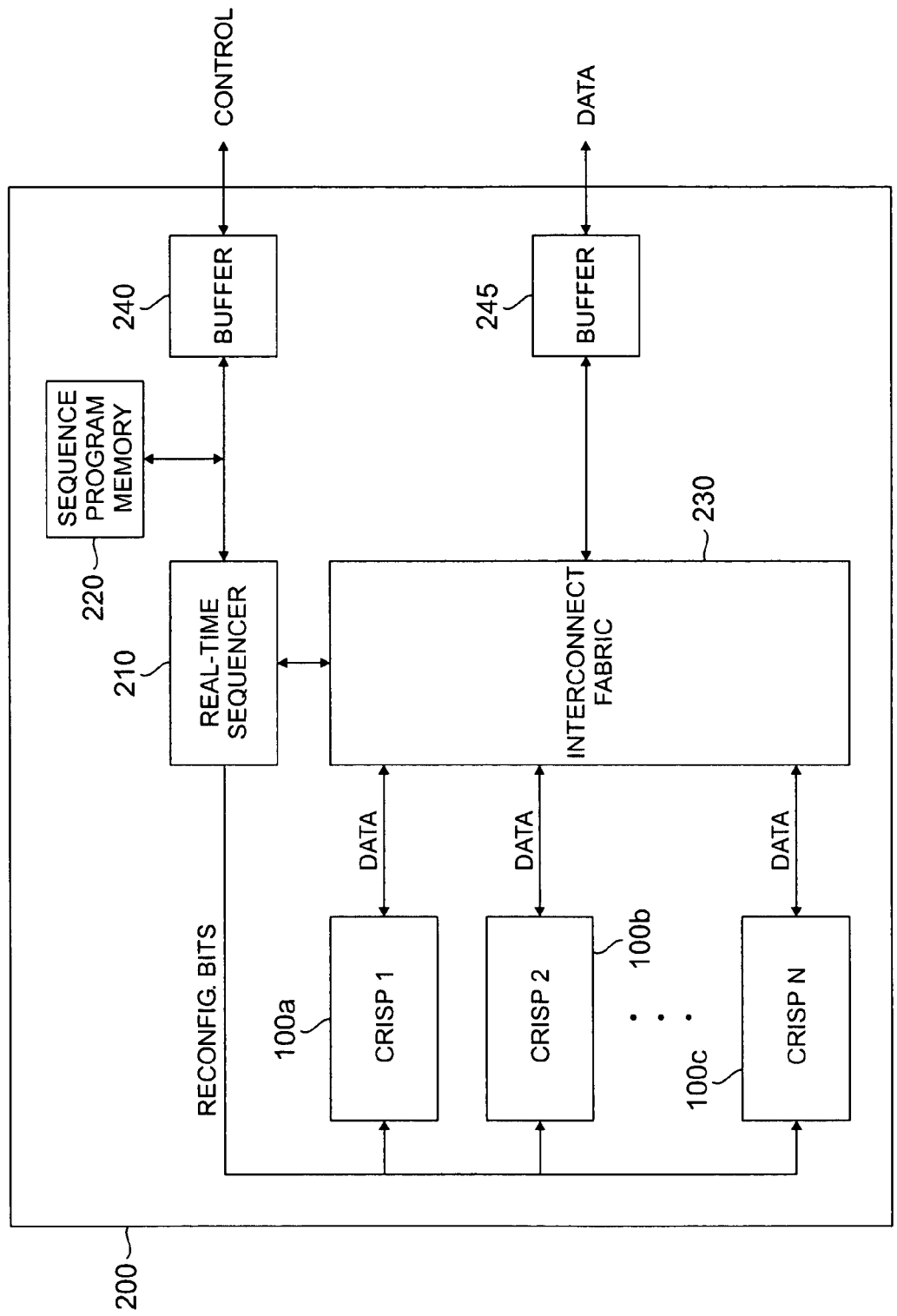
FIG. 2 is a high-level block diagram of a reconfigurable processing system.

FIG. 2 is a high-level block diagram of reconfigurable processing system 200 according to one embodiment of the present disclosure. Reconfigurable processing system 200 comprises N context-based operation reconfigurable instruction set processors (CRISPS), including exemplary CRISPs 100a, 100b, and 100c, which are arbitrarily labeled CRISP 1, CRISP 2 and CRISP N. Reconfigurable processing system 200 further comprises real-time sequencer 210, sequence program memory 220, programmable interconnect fabric 230, and buffers 240 and 245.

Reconfiguration bits may be loaded into CRISPs 100a, 100b, and 100c from the CONTROL line via real-time sequencer 210 and buffer 240. A control program may also be loaded into sequence program memory 220 from the CONTROL line via buffer 240. Real-time sequencer 210 sequences the contexts to be executed by each one of CRISPs 100a-c by retrieving program instructions from program memory 220 and sending reconfiguration bits to CRISPs 100a-c. In an exemplary embodiment, real-time sequencer 210 may comprise a stack processor, which is suitable to operate as a real-time scheduler due to its low latency and simplicity.

Reconfigurable interconnect fabric 230 provides connectivity between each one of CRISPs 100a-c and an external DATA bus via bi-directional buffer 245. In an exemplary embodiment of the present disclosure, each one of CRISPs 100a-c may act as a master of reconfigurable interconnect fabric 230 and may initiate address access. The bus arbiter for reconfigurable interconnect fabric 230 may be internal to real-time sequencer 210.

In an exemplary embodiment, reconfigurable processing system 200 may be, for example, a cell phone or a similar wireless device, or a data processor for use in a laptop computer. In a wireless device embodiment based on a software-defined radio (SDR) architecture, each one of CRISPs 100a-c is responsible for executing a subset of context-related instructions that are associated with a particular reconfigurable function. For example, CRISP 100a may be configured to execute context-related instructions that process CDMA baseband signals or OFDMA baseband signals. CRISP 100b may be configured to execute context-related instructions that act as a memory controller. CRISP 100c may be configured to execute context-related instructions that perform turbo decoding or Viterbi decoding.

Since CRISP devices are largely independent and may be run simultaneously, a Viterbi decoder implemented using one or more CRISP devices has the performance advantage of parallelism without incurring the full power penalty associated with running parallel operations. The loose coupling and independence of CRISP devices allows them to be configured for different systems and functions that may be shut down separately.

Figure 3:
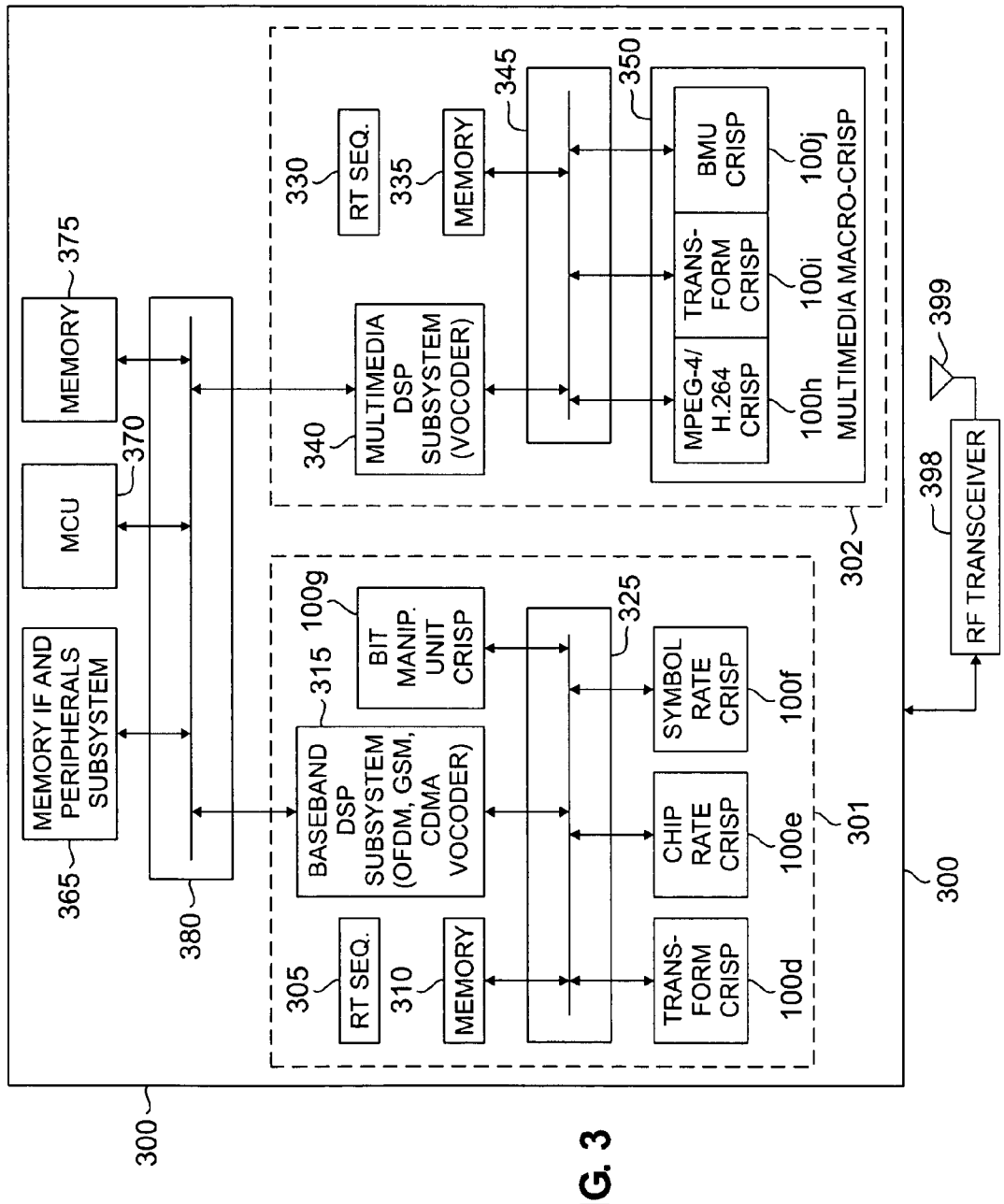
FIG. 3 is a high-level block diagram of a multi-standard software-defined radio (SDR) system that implements a reconfigurable Viterbi decoder using at least one CRISP device.

FIG. 3 is a high-level block diagram of multi-standard software-defined radio (SDR) system 300, which implements a reconfigurable Viterbi decoder using a CRISP device. SDR system 300 may comprise a wireless terminal (or mobile station, subscriber station, etc.) that accesses a wireless network, such as, for example, a GSM or CDMA cellular telephone, a PDA with WCDMA, IEEE-802.11x, HSDPA, OFDM/OFDMA capabilities, or the like.

Multi-standard SDR system 300 comprises baseband subsystem 301, applications subsystem 302, memory interface (IF) and peripherals subsystem 365, main control unit (MCU) 370, memory 375, and interconnect 380. MCU 370 may comprise, for example, a conventional microcontroller or a microprocessor (e.g., x86, ARM, RISC, DSP, etc.). Memory IF and peripherals subsystem 365 may connect SDR system 300 to an external memory (not shown) and to external peripherals (not shown). Memory 375 stores data from other components in SDR system 300 and from external devices (not shown). For example, memory 375 may store a stream of incoming data samples associated with a down-converted signal generated by radio frequency (RF) transceiver 398 and antenna 399 associated with SDR system 300. Interconnect 380 acts as a system bus that provides data transfer between subsystems 301 and 302, memory IF and peripherals subsystem 365, MCU 370, and memory 375.

Baseband subsystem 301 comprises real-time (RT) sequencer 305, memory 310, baseband DSP subsystem 315, interconnect 325, and a plurality of special purpose context-based operation instruction set processors (CRISPs), including transform CRISP 100d, chip rate CRISP 100e, symbol rate CRISP 100f, and bit manipulation unit (BMU) CRISP 100g. By way of example, transform CRISP 100d may implement a Fast Fourier Transform (FFT) function, chip rate CRISP 100e may implement a correlation function for a CDMA signal, and symbol rate CRISP 100f may implement a turbo decoder function or a Viterbi decoder function.

In such an exemplary embodiment, transform CRISP 100d may receive samples of an intermediate frequency (IF) signal stored in memory 375 and perform an FFT function that generates a sequence of chip samples at a baseband rate. Next, chip rate CRISP 100e receives the chip samples from transform CRISP 100d and performs a correlation function that generates a sequence of data symbols. Next, symbol rate CRISP 100f receives the symbol data from chip rate CRISP 100e and performs turbo decoding or Viterbi decoding to recover the baseband user data. The baseband user data may then be used by applications subsystem 302.

In an exemplary embodiment of the present disclosure, symbol rate CRISP 100f may comprise two or more CRISPs that operate in parallel. Also, by way of example, BMU CRISP 100g may implement such functions as variable length coding, cyclic redundancy check (CRC), convolutional encoding, and the like. Interconnect 325 acts as a system bus that provides data transfer between RT sequencer 305, memory 310, baseband DSP subsystem 315 and CRISPs 100d-100g.

Applications subsystem 302 comprises real-time (RT) sequencer 330, memory 335, multimedia DSP subsystem 340, interconnect 345, and multimedia macro-CRISP 350. Multimedia macro-CRISP 350 comprises a plurality of special purpose context-based operation instruction set processors, including MPEG-4/H.264 CRISP 550h, transform CRISP 550i, and BMU CRISP 100j. In an exemplary embodiment of the disclosure, MPEG-4/H.264 CRISP 550h performs motion estimation functions and transform CRISP 100h performs a discrete cosine transform (DCT) function. Interconnect 380 provides data transfer between RT sequencer 330, memory 335, multimedia DSP subsystem 340, and multimedia macro-CRISP 350.

In the embodiment in FIG. 3, the use of CRISP devices enables applications subsystem 302 of multi-standard SDR system 300 to be reconfigured to support multiple video standards with multiple profiles and sizes. Additionally, the use of CRISP devices enables baseband subsystem 301 of multi-standard SDR system 300 to be reconfigured to support multiple air interface standards. Thus, SDR system 300 is able to operate in different types of wireless networks (e.g., CDMA, GSM, 802.11x, etc.) and can execute different types of video and audio formats. However, the use of CRISPS according to the principles of the present disclosure enables SDR system 300 to perform these functions with much lower power consumption than conventional wireless devices having comparable capabilities.

Figure 4:
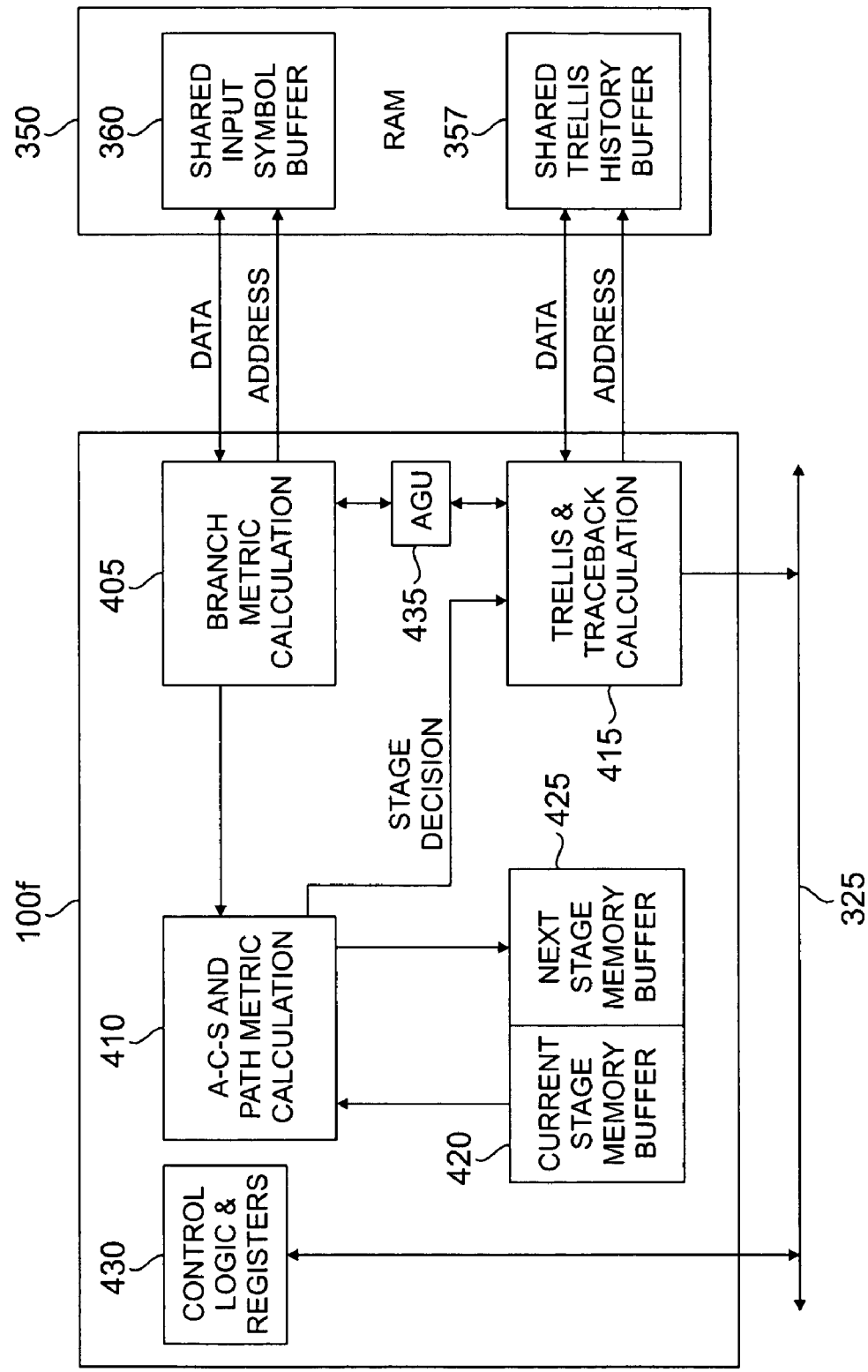
FIG. 4 is a block diagram of a reconfigurable Viterbi decoder implemented in a CRISP according to the principles of the disclosure.

FIG. 4 is a block diagram of a reconfigurable Viterbi decoder implemented in CRISP 100f according to the principles of the disclosure. The reconfigurable Viterbi decoder comprises branch metric calculation block 405, add-compare-select (ACS) and path metric calculation block 410, trellis and traceback calculation block 415, current stage memory buffer 420, next stage memory buffer 425, control logic and registers block 430, and address generation unit (AGU) 435. The reconfigurable Viterbi decoder is associated with memory 350, which may be a separate device from CRISP 100f, as depicted in FIG. 4, or may be an integral part of CRISP 100f. Memory 360 is logically divided into shared input symbol buffer 360 and shared trails history buffer 370. In an exemplary embodiment, memory 350 may comprise a 32 Kbyte random access memory (RAM).

Control logic and registers block 430 comprises a programmable finite state machine and associated control registers that controls the overall operation of CRISP 100f and reconfigures the functional blocks of the data path, including, for example, branch metric calculation block 405, add-compare-select (ACS) and path metric calculation block 410, trellis and traceback calculation block 415, current stage memory buffer 420, and next stage memory buffer 425.

Address generation unit 435 controls the read and write operations to memory 350 that are made by branch metric calculation block 405 and trellis and traceback calculation block 415. Chip rate CRISP 100e or another component in baseband subsystem 301 writes symbol data samples into shared input symbol buffer 360. Branch metric calculation block 405 then reads the symbol data samples from shared input symbol buffer 360. Trellis and traceback calculation block 415 writes hard decoded trellis data in shared trellis history buffer 370 and reads back the stored hard decoded trellis data in later cycles.

As is well known, the Viterbi algorithm is often represented as a trellis diagram. The trellis is a time-indexed version of a state diagram. Each time instant in the trellis may contain two states, four states, eight states, or more. The maximum likelihood detection of a digital stream with intersymbol interference can be described as finding the most probable path through a trellis of state transitions (branches). Each state corresponds to a possible pattern of recently received data bits and each branch of the trellis corresponds to the reception of the next (noisy) input. The branch metrics represent the costs of traversing along specific branches. The path (or state) metrics accumulate the minimum cost of arriving at a specific state. The path metrics are updated using an add-compare-select recursion. At each time instant, the branch metrics are added to the path (state) metrics of the previous time instant. The smallest path metric is then selected to be the new path metric for each state. Finally, after all of the input symbol samples are processed, the minimum path value represents the survivor sequence. Tracing backwards through the trellis gives the likely sequence of transmitted data.

Branch metric calculation block 405 is a reconfigurable device that is reconfigured by means of control parameters and data written into control logic and registers block 430. Branch metric calculation block 405 calculates four possible branch metric values by calculating the distances of input symbol samples from target values according to well-known principles. By way of example, branch metric calculation block 405 may read in 8-bit "soft" symbol samples (e.g., 256 level 2s complement) from shared input symbol buffer 360 and may output four (4) branch metric values, each containing 16 bits. The branch metric values are typically Hamming distances (or other metric values) that are computed at each time instance for the paths between the states at the previous time instant and the states at the current time instant.

ACS and path metric calculation block 410 also is a reconfigurable device that is reconfigured by means of control parameters and data written into control logic and registers block 430. ACS and path metric calculation block 410 calculates the new value of the path (or state) metric at each stage (i.e., time instant) of the trellis. The minimum path metric is then output as a Stage Decision to trellis and traceback calculation block 415. ACS and path metric calculation block 410 reads the current path metrics (e.g., 4 path metrics) from current stage memory buffer 420 and adds the current path metrics to the branch metrics from branch metric calculation block 405 and stores the new path metrics in next stage memory buffer 425. Next stage memory buffer 425 and current stage memory buffer 420 then switch identities, so that next stage memory buffer 425 becomes current stage memory buffer 420 and current stage memory buffer 420 becomes next stage memory buffer 425.

Trellis and traceback calculation block 415 receives the stage decision values from ACS and path metric calculation block 410 and stores the hard decoded values in shared trails history buffer. When an entire block of symbol samples had been processed and the trellis is completed in shared trails history buffer, trellis and traceback calculation block 415 then traces back through the shortest path in the trellis in order to decode the input sequence.

In an advantageous embodiment, the reconfigurable Viterbi decoder in CRISP 100f provides fully programmable feed-forward channel decoding and traceback sessions that support: i) channel decoding with constraint lengths of, for example, K=5, K=6, K=7 and K=9; ii) puncture codes; and iii) rate=½, ⅓, ¼ and ⅙ by four, fully programmable polynomials. Shared trellis history buffer 370 may support up to 512 stages for K=9 or 8192 stages for K=5. The reconfigurable Viterbi decoder in CRISP 100f further supports a block length of symbol data in memory 350 that is fully programmable and also supports programmable traceback methods.

An external controller, such as baseband DSP subsystem 315 or MCU 370 programs the reconfigurable Viterbi decoder while CRISP 100f is in Wake-Up mode. The reconfigurable Viterbi decoder in CRISP 100f can then execute independently on the whole block of data in memory 350 based on the programmed registers and the dedicated instructions in block 430. Data is written to and read from memory 350 in CRISP 100f via the bus in interconnect 325. The addresses of shared input symbol buffers 360 and shared trellis history buffer 370 are fully programmable.

Figure 5:
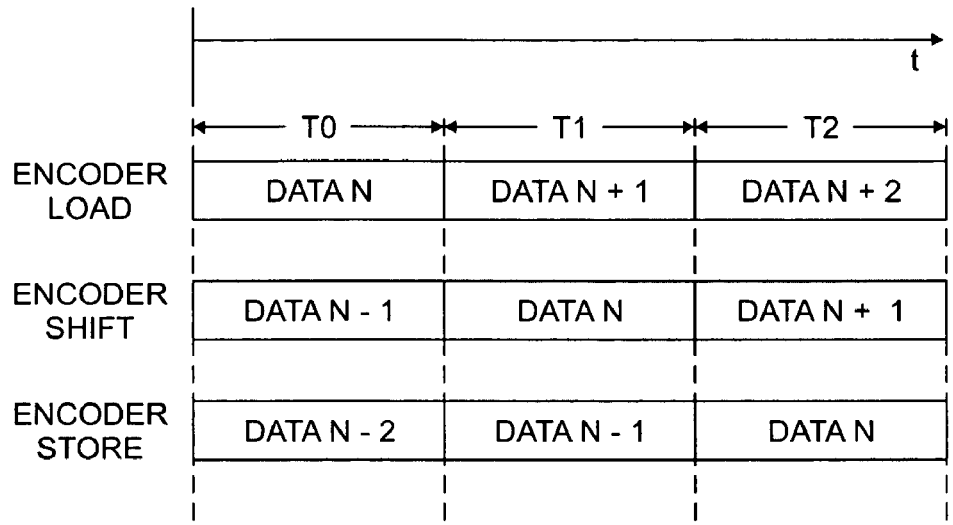
FIG. 5 is timing diagram of selected pipeline stages in a convolution encoder.

FIGS. 5-8 illustrate the piplelined architectures of selected components in CRIPS 100f and of the convolutional coder in the transmitting device. FIG. 5 is timing diagram of selected pipeline stages in a convolution encoder that encodes the data that the Viterbi decoder decodes. The convolutional encoder comprises an encoder load stage, an encoder shift stage, and an encoder store stage. Sequential time periods T0, T1, and T2 are shown. The convolutional encoder receives five sequential blocks of data in the following order (from left to right): [ . . . , N−2, N−1, N, N+1, N+2]. During T0, the encoder load stage processes the Data N block, the encoder shift stage processes the Data N−1 block, and the encoder store stage processes the Data N−2 block. During T1, the encoder load stage processes the Data N+1 block, the encoder shift stage processes the Data N block, and the encoder store stage processes the Data N−1 block. During T3, the encoder load stage processes the Data N+2 block, the encoder shift stage processes the Data N+1 block, and the encoder store stage processes the Data N block.

Figure 6:
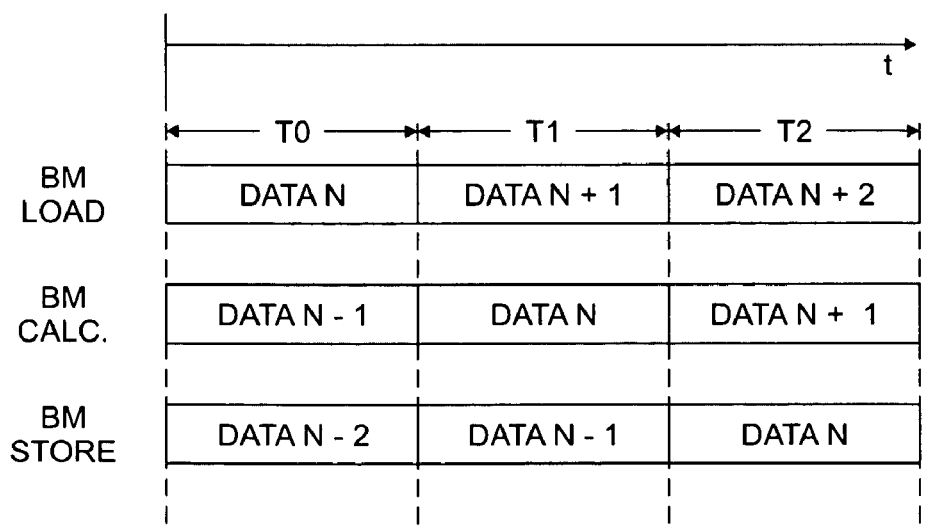
FIG. 6 is timing diagram of selected pipeline stages in a branch metric calculation block.

FIG. 6 is timing diagram of selected pipeline stages in a branch metric calculation block 405. Branch metric calculation block 405 comprises a branch metric load stage, a branch metric calculation stage, and a branch metric store stage. Branch metric calculation block 405 receives five sequential blocks of data in the following order (from left to right): [ . . . , N−2, N−1, N, N+1, N+2]. During T0, the branch metric load stage processes the Data N block, the branch metric calculation stage processes the Data N−1 block, and the branch metric store stage processes the Data N−2 block. During T1, the branch metric load stage processes the Data N+1 block, the branch metric calculation stage processes the Data N block, and the branch metric store stage processes the Data N−1 block. During T3, the branch metric load stage processes the Data N+2 block, the branch metric calculation stage processes the Data N+1 block, and the encoder store stage processes the Data N block.

Figure 7:
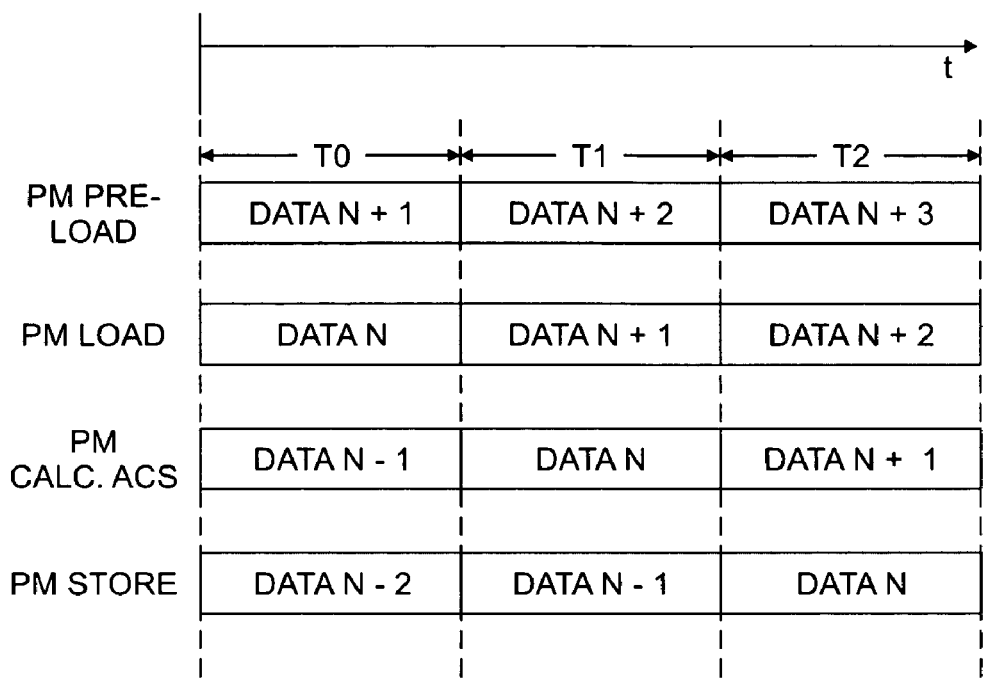
FIG. 7 is timing diagram of selected pipeline stages in a path metric calculation block.

FIG. 7 is timing diagram of selected pipeline stages in a path metric calculation block. The path metric calculation block comprises a path metric pre-load stage, a path metric load stage, a path metric calculation ACS stage, and a path metric store stage. The path metric calculation block receives six sequential blocks of data in the following order (from left to right): [ . . . , N−2, N−1, N, N+1, N+2, N+3]. During T0, the path metric pre-load stage processes the Data N+1 block, the path metric load stage processes the Data N block, the path metric calculation ACS stage processes the Data N−1 block, and the path metric store stage processes the Data N−2 block. During T1, the path metric pre-load stage processes the Data N+2 block, the path metric load stage processes the Data N+1 block, the path metric calculation ACS stage processes the Data N block, and the path metric store stage processes the Data N−1 block. During T2, the path metric pre-load stage processes the Data N+3 block, the path metric load stage processes the Data N+2 block, the path metric calculation ACS stage processes the Data N+1 block, and the path metric store stage processes the Data N block.

Figure 8:
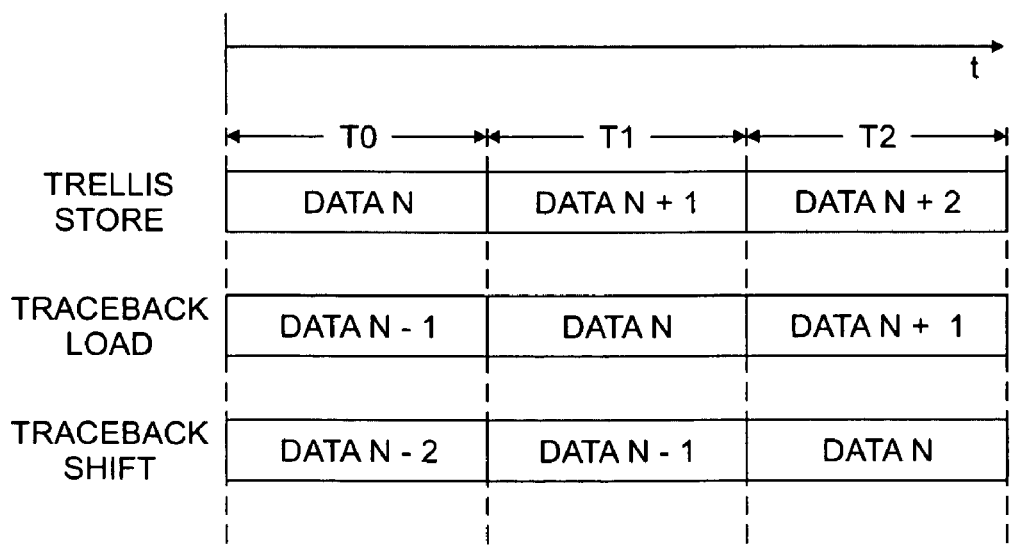
FIG. 8 is timing diagram of selected pipeline stages in a trellis and traceback calculation block.

FIG. 8 is timing diagram of selected pipeline stages in trellis and traceback calculation block 415. Trellis and traceback calculation block 415 comprises a trellis store stage, a traceback load stage, and a traceback shift stage. Trellis and traceback calculation block 415 receives five sequential blocks of data in the following order (from left to right): [ . . . , N−2, N−1, N, N+1, N+2]. During T0, the trellis store stage processes the Data N block, the traceback load stage processes the Data N−1 block, and the traceback shift stage processes the Data N−2 block. During T1, the trellis store stage processes the Data N+1 block, the traceback load stage processes the Data N block, and the traceback shift stage processes the Data N−1 block. During T2, the trellis store stage processes the Data N+2 block, the traceback load stage processes the Data N+1 block, and the traceback shift stage processes the Data N block.

Although the present disclosure has been described with an exemplary embodiment, various changes and modifications may be suggested to one skilled in the art. It is intended that the present disclosure encompass such changes and modifications as fall within the scope of the appended claims.

What is claimed is:

1. A reconfigurable Viterbi decoder comprising:
   a reconfigurable data path comprising a plurality of reconfigurable functional blocks, the plurality of reconfigurable functional blocks including:
      i) a reconfigurable branch metric calculation block; and
      ii) a reconfigurable add-compare-select and path metric calculation block; and
   a programmable finite state machine for controlling the reconfigurable data path, wherein the programmable finite state machine executes a plurality of context-related instructions associated with the reconfigurable Viterbi decoder,
   wherein the reconfigurable Viterbi decoder is implemented using a plurality of context-based operation reconfigurable instruction set processor (CRISP) devices that shut down independently of each other.

2. The reconfigurable Viterbi decoder as set forth in claim 1, wherein the reconfigurable data path is configured by reconfiguration bits received from an external device.

3. The reconfigurable Viterbi decoder as set forth in claim 2, wherein the programmable finite state machine is configured by reconfiguration bits received from the external device.

4. The reconfigurable Viterbi decoder as set forth in claim 2, wherein the reconfigurable Viterbi decoder may be put into a low power mode by the external device during a time period in which the reconfigurable Viterbi decoder is not required to decode input data.

5. The reconfigurable Viterbi decoder as set forth in claim 1, wherein the reconfigurable branch metric calculation block comprises a plurality of pipelined stages capable of calculating branch metric values from input symbol samples.

6. The reconfigurable Viterbi decoder as set forth in claim 5, wherein the reconfigurable add-compare-select and path metric calculation block comprises a plurality of pipelined stages capable of calculating path metric values from branch metric values received from the reconfigurable branch metric calculation block.

7. The reconfigurable Viterbi decoder as set forth in claim 6, wherein the plurality of reconfigurable functional blocks further includes a reconfigurable trellis and traceback calculation block.

8. The reconfigurable Viterbi decoder as set forth in claim 7, wherein the reconfigurable trellis and traceback calculation block comprises a plurality of pipelined stages capable of generating a trellis of state information from path metric values received from the reconfigurable add-compare-select and path metric calculation block.

9. The reconfigurable Viterbi decoder as set forth in claim 8, wherein the reconfigurable trellis and traceback calculation block is configured by reconfiguration bits received from an external device.

10. The reconfigurable Viterbi decoder as set forth in claim 9, wherein the reconfigurable trellis and traceback calculation block outputs a single hard decoded bit to an external bus for each stage in the trellis.

11. A software-defined radio (SDR) system comprising:
   a radio-frequency (RF) transceiver portion capable of being reconfigured to operate under a plurality of wireless communication standards; and
   a reconfigurable baseband processing portion associated with the RF transceiver portion, the reconfigurable baseband processing portion including a reconfigurable Viterbi decoder comprising:
      a reconfigurable data path comprising a plurality of reconfigurable functional blocks, the plurality of reconfigurable functional blocks including:
         i) a reconfigurable branch metric calculation block; and
         ii) a reconfigurable add-compare-select and path metric calculation block; and
      a programmable finite state machine for controlling the reconfigurable data path, wherein the programmable finite state machine executes a plurality of context-related instructions associated with the reconfigurable Viterbi decoder,
      wherein the reconfigurable Viterbi decoder is implemented using a plurality of context-based operation reconfigurable instruction set processor (CRISP) devices that shut down independently of each other.

12. The software-defined radio (SDR) system as set forth in claim 11, wherein the reconfigurable data path is configured by reconfiguration bits received from an external device.

13. The software-defined radio (SDR) system as set forth in claim 12, wherein the programmable finite state machine is configured by reconfiguration bits received from the external device.

14. The software-defined radio (SDR) system as set forth in claim 12, wherein the reconfigurable Viterbi decoder may be put into a low power mode by the external device during a time period in which the reconfigurable Viterbi decoder is not required to decode input data.

15. The software-defined radio (SDR) system as set forth in claim 11, wherein the reconfigurable branch metric calculation block comprises a plurality of pipelined stages capable of calculating branch metric values from input symbol samples.

16. The software-defined radio (SDR) system as set forth in claim 15, wherein the reconfigurable add-compare-select and path metric calculation block comprises a plurality of pipelined stages capable of calculating path metric values from branch metric values received from the reconfigurable branch metric calculation block.

17. The software-defined radio (SDR) system as set forth in claim 16, wherein the plurality of reconfigurable functional blocks further includes a reconfigurable trellis and traceback calculation block.

18. The software-defined radio (SDR) system as set forth in claim 17, wherein the reconfigurable trellis and traceback calculation block comprises a plurality of pipelined stages capable of generating a trellis of state information from path metric values received from the reconfigurable add-compare-select and path metric calculation block.

19. The software-defined radio (SDR) system as set forth in claim 18, wherein the reconfigurable trellis and traceback calculation block is configured by reconfiguration bits received from an external device.

20. The software-defined radio (SDR) system as set forth in claim 19, wherein the reconfigurable trellis and traceback calculation block outputs a single hard decoded bit to an external bus for each stage in the trellis.

21. A Viterbi algorithm execution unit, comprising:
  a reconfigurable data path comprising a plurality of reconfigurable functional blocks, the plurality of reconfigurable functional blocks including:
    i) a reconfigurable branch metric calculation block; and
    ii) a reconfigurable add-compare-select and path metric calculation block; and
  a programmable finite state machine for controlling the reconfigurable data path, wherein the programmable finite state machine executes a plurality of context-related instructions associated with the Viterbi algorithm execution unit,
  wherein the Viterbi algorithm execution unit is implemented using a plurality of context-based operation reconfigurable instruction set processor (CRISP) devices that shut down independently of each other.

22. The Viterbi algorithm execution unit as set forth in claim 21, wherein the reconfigurable data path is configured by reconfiguration bits received from an external device.

23. The Viterbi algorithm execution unit as set forth in claim 21, wherein the programmable finite state machine is configured by reconfiguration bits received from an external device.

24. The Viterbi algorithm execution unit as set forth in claim 22, wherein the Viterbi algorithm execution unit may be put into a low power mode by the external device during a time period in which the Viterbi algorithm execution unit is not required to decode input data.

25. The Viterbi algorithm execution unit as set forth in claim 21, wherein the reconfigurable branch metric calculation block comprises a plurality of pipelined stages capable of calculating branch metric values from input symbol samples.

26. The Viterbi algorithm execution unit as set forth in claim 25, wherein the reconfigurable add-compare-select and path metric calculation block comprises a plurality of pipelined stages capable of calculating path metric values from branch metric values received from the reconfigurable branch metric calculation block.

27. The Viterbi algorithm execution unit as set forth in claim 26, wherein the plurality of reconfigurable functional blocks further includes a reconfigurable trellis and traceback calculation block.

28. The Viterbi algorithm execution unit as set forth in claim 27, wherein the reconfigurable trellis and traceback calculation block comprises a plurality of pipelined stages capable of generating a trellis of state information from path metric values received from the reconfigurable add-compare-select and path metric calculation block.

29. The Viterbi algorithm execution unit as set forth in claim 28, wherein the reconfigurable trellis and traceback calculation block is configured by reconfiguration bits received from an external device.

30. The Viterbi algorithm execution unit as set forth in claim 29, wherein the reconfigurable trellis and traceback calculation block outputs a single hard decoded bit to an external bus for each stage in the trellis.

31. A software-defined radio (SDR) system comprising:
  a radio-frequency (RF) transceiver portion capable of being reconfigured to operate under a plurality of wireless communication standards; and
  a reconfigurable baseband processing portion associated with the RF transceiver portion, the reconfigurable baseband processing portion including a Viterbi algorithm execution unit comprising:
    a reconfigurable data path comprising a plurality of reconfigurable functional blocks, the plurality of reconfigurable functional blocks including:
      i) a reconfigurable branch metric calculation block; and
      ii) a reconfigurable add-compare-select and path metric calculation block; and
    a programmable finite state machine for controlling the reconfigurable data path, wherein the programmable finite state machine executes a plurality of context-related instructions associated with the Viterbi algorithm execution unit,
    wherein the Viterbi algorithm execution unit is implemented using a plurality of context-based operation reconfigurable instruction set processor (CRISP) devices that shut down independently of each other.

32. The software-defined radio (SDR) system as set forth in claim 31, wherein the reconfigurable data path is configured by reconfiguration bits received from an external device.

33. The software-defined radio (SDR) system as set forth in claim 31, wherein the programmable finite state machine is configured by reconfiguration bits received from an external device.

34. The software-defined radio (SDR) system as set forth in claim 32, wherein the Viterbi algorithm execution unit may be put into a low power mode by the external device during a time period in which the Viterbi algorithm execution unit is not required to decode input data.

35. The software-defined radio (SDR) system as set forth in claim 31, wherein the reconfigurable branch metric calculation block comprises a plurality of pipelined stages capable of calculating branch metric values from input symbol samples.

36. The software-defined radio (SDR) system as set forth in claim 35, wherein the reconfigurable add-compare-select and path metric calculation block comprises a plurality of pipelined stages capable of calculating path metric values from branch metric values received from the reconfigurable branch metric calculation block.

37. The software-defined radio (SDR) system as set forth in claim 36, wherein the plurality of reconfigurable functional blocks further includes a reconfigurable trellis and traceback calculation block.

38. The software-defined radio (SDR) system as set forth in claim 37, wherein the reconfigurable trellis and traceback calculation block comprises a plurality of pipelined stages capable of generating a trellis of state information from path metric values received from the reconfigurable add-compare-select and path metric calculation block.

39. The software-defined radio (SDR) system as set forth in claim 38, wherein the reconfigurable trellis and traceback calculation block is configured by reconfiguration bits received from an external device.

40. The software-defined radio (SDR) system as set forth in claim 39, wherein the reconfigurable trellis and traceback calculation block outputs a single hard decoded bit to an external bus for each stage in the trellis.

41. A method for reconfiguring a data path having a plurality of reconfigurable functional blocks, comprising:
controlling the plurality of reconfigurable functional blocks with a programmable finite state machine; and
executing a plurality of context-related instructions associated with a Viterbi algorithm execution unit using the programmable finite state machine, wherein the Viterbi algorithm execution unit is implemented using a plurality of context-based operation reconfigurable instruction set processor (CRISP) devices that shut down independently of each other.

42. The method set forth in claim 41, further comprising configuring the data path using reconfiguration bits received from an external device.

43. The method set forth in claim 41, further comprising configuring the programmable finite state machine using reconfiguration bits received from an external device.

44. The method set forth in claim 42, further comprising setting the Veterbi algorithm execution unit to a low power mode to the Viterbi algorithm execution unit using the external device during a time period in which the Viterbi algorithm execution unit is not required to decode input data.

45. The method set forth in claim 41, further comprising calculating branch metric values from input symbol samples.

46. The method set forth in claim 45, further comprising calculating path metric values from the branch metric values.

47. The method set forth in claim 46, wherein the plurality of reconfigurable functional blocks further includes a reconfigurable trellis and traceback calculation block.

48. The method set forth in claim 47, further comprising generating a trellis of state information from the path metric values using the reconfigurable trellis and traceback calculation block.

49. The method set forth in claim 48, further comprising configuring the reconfigurable trellis and traceback calculation block using reconfiguration bits received from an external device.

50. The method set forth in claim 49, further comprising outputting a single hard decoded bit to an external bus for each stage in the trellis using the reconfigurable trellis and traceback calculation block.

* * * * *

UNITED STATES PATENT AND TRADEMARK OFFICE
CERTIFICATE OF CORRECTION

PATENT NO. : 7,603,613 B2
APPLICATION NO. : 11/314460
DATED : October 13, 2009
INVENTOR(S) : Pisek et al.

Page 1 of 1

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 909 days.

Signed and Sealed this

Fifth Day of October, 2010

David J. Kappos
*Director of the United States Patent and Trademark Office*